United States Patent [19]

Herlitz

[11] Patent Number: 5,455,928
[45] Date of Patent: Oct. 3, 1995

[54] METHOD FOR MODELING BIDIRECTIONAL OR MULTIPLICATIVELY DRIVEN SIGNAL PATHS IN A SYSTEM TO ACHIEVE A GENERAL PURPOSE STATICALLY SCHEDULED SIMULATOR

[75] Inventor: Lars G. Herlitz, San Mateo, Calif.

[73] Assignee: Cadence Design Systems, Inc., San Jose, Calif.

[21] Appl. No.: 76,015

[22] Filed: Jun. 14, 1993

[51] Int. Cl.⁶ .................................. G06F 9/455
[52] U.S. Cl. .................. 395/500; 364/474.24; 364/490; 364/578; 364/DIG. 1
[58] Field of Search ........................ 395/500; 364/474.24, 364/490, 578

[56] References Cited

U.S. PATENT DOCUMENTS 4,584,642  4/1986  Fudanuki ................................ 395/500
5,111,413  5/1992  Lazansky et al. ...................... 364/578

OTHER PUBLICATIONS

Ho et al., "High Level Data Flow Programming for Digital Signal Processing", VLSI Signal Processing III, 1988, IEEE, pp. 385–395.
Ha et al., "Quasi–static Scheduling for Multiprocessor DSP", Circuits and Systems, 1991 IEEE International Symposium, pp. 352–355.
Edward A. Lee, "Consistency in Data Flow Graphs", Application Specific Array Processors, 1991 International Conference, IEEE, pp. 355–369.
Dorothy Janson, "A Static Scheduler for the Computer Aided Prototyping System", Computer Assurance: Compass '88, IEEE, pp. 92–98.
Zein et al., "HLSIM–A New Hierarchical Logic Simulator in APL", VLSI Test Symposium, 1992 IEEE, pp. 333–338.
Fischer et al., "NETHDL: Abstraction of Schematics to High–Level HDL", European Design Automation Conference, 1990, IEEE, pp. 90–96.

Primary Examiner—William M. Treat
Attorney, Agent, or Firm—John T. McNelis; Philip E. Blair

[57] ABSTRACT

A method is disclosed whereby systems having bidirectional and/or multiplicatively driven data paths are statically scheduled for simulation. The method flattens the netlist to convert bidirectional data flow paths into unidirectional, multiplicatively driven data paths. All drivers connected to multiplicatively driven data paths (or nets) are isolated from the net using a bus resolution block. The bus resolution block implements a resolution function which permits the system to be statically scheduled for simulation. Simulation speed is increased substantially thereby.

1 Claim, 2 Drawing Sheets

FIG. 2

```
FOR each net n in design
  IF number of drivers of net > 1
    FOR EACH driver d
      IF this is the first driver
        input1 = d;
      ELSE
        input2 = d;
        Insert new bus resolution block and connect its two inputs to
          input1 and input2;
        input1 = the output of the last inserted resolution block;
      END IF
    END FOR
    Connect the output of the last inserted resolution block to all
    input pins on net d;
  END IF
END FOR
```

FIG. 3

|         |         | NO CONTENTION ALLOWED | WIRED OR FUNCTION |
|---------|---------|-----------------------|-------------------|
| INPUT A | INPUT B | OUTPUT                | OUTPUT            |
| Z       | Z       | Z                     | Z                 |
| Z       | 1       | 1                     | 1                 |
| 1       | Z       | 1                     | 1                 |
| Z       | 0       | 0                     | 0                 |
| 0       | Z       | 0                     | 0                 |
| 0       | 0       | ERROR                 | 0                 |
| 1       | 0       | ERROR                 | 0                 |
| 0       | 1       | ERROR                 | 0                 |
| 1       | 1       | ERROR                 | 1                 |

METHOD FOR MODELING BIDIRECTIONAL OR MULTIPLICATIVELY DRIVEN SIGNAL PATHS IN A SYSTEM TO ACHIEVE A GENERAL PURPOSE STATICALLY SCHEDULED SIMULATOR

FIELD OF THE INVENTION

This invention relates to the statically scheduled simulation of the data flow behavior of a given system, and more particularly to the extension of such simulation from the single sourced, unidirectional signal flow characteristics typical of digital signal processing (DSP) systems to the general case where signal flow on a given signal path may emanate from multiple drivers, such as on busses which are often bidirectional and/or multiplexed in nature.

BACKGROUND OF THE INVENTION

Over the past decade, semiconductor process technology has rapidly progressed to permit ever more complex systems to be integrated onto a single monolithic chip. As a result, system designers have increased their demand for computer aided design (CAD) tools to automate the design process and thereby reduce the time necessary to implement their system designs in silicon.

What was once a "bottom-up" design process, beginning from the circuit and gate level and working toward the system level, has become an increasingly "top-down" process, whereby the system designer designs a system at the abstract or behavioral level and works down toward its implementation on the circuit and gate level.

A number of factors have been responsible for the move to a "top-down" approach. First, the availability of standard cell libraries, gate-arrays and ASIC technology has provided the system designer with generic semiconductor building blocks with which to implement system designs. Further, CAD tools such as System 1076 by Mentor are able to create hardware descriptions of systems designs using a standard language such as VHDL (Very High-Scale Integrated Circuit Hardware Description Logic). A system represented in VHDL can then be fed into a synthesis tool, which converts the VHDL representation into an actual circuit block implementation for a given semiconductor technology. An example of a synthesis tool is Design Compiler by Synopsys.

Before a system design can be implemented in silicon, its behavior must be verified as that which is desired by the designer. CAD tools such as System 1076 by Mentor simulate the system once it has been converted to a VHDL representation to verify logical behavior and/or timing behavior of the system. Simulators such as System 1076 are event-driven simulators. They execute models of the functions comprising the system by dynamically scheduling the execution of those functions at run-time.

Event driven simulators are extremely slow and resource intensive, however, particularly for very complex systems. Because they do not know, a priori, the order in which particular functional blocks will be executed, they must maintain an event queue to schedule the execution of blocks in the future. This dynamic schedule can change at any time by the occurrence of unexpected intervening events, and must therefore be constantly updated during execution. Further, if the input to a particular functional block is fired (i.e. the block which is its output is executed), the simulator will execute the block even if the result of that execution is only an intermediate result with no impact on the overall system. Finally, the execution schedule which is ultimately simulated will not be the most optimal.

For some time, those skilled in the art have known that digital signal processing systems can be represented by signal flow diagrams. A technical article which discusses in detail background information regarding the representation of systems using synchronous data flow diagrams is E. A. Lee and D. G. Messerschmitt, "Static Scheduling of Synchronous Data Flow Programs for Digital Signal Processing," IEEE Transactions or Computers, 24–35 (1987), which is by this statement incorporated herein by reference. DSP systems are particularly amenable to this representation because the inherent nature of the algorithms which are employed in DSP systems require signals to flow from one block to another unidirectionally, and only one source for data flow is permitted per data path. Those skilled in the art have also known that such systems may be statically scheduled such that a priori, the system designer knows precisely in what order at any point in time when a particular block in the system will be executed. A method for optimizing the static schedule for a signal flow diagram is disclosed in the commonly owned U.S. patent application Ser. No. 08/053,607, which is by this statement incorporated herein by reference.

Those skilled in the art also have known that the data flow behavior of these systems may be simulated according to the static schedule optimized by the designer. Because such a simulator requires no event queue, and because the simulator will not execute system blocks unnecessarily, a statically scheduled simulation can run significantly faster than event driven simulators.

Up until the present, those of ordinary skill in the art and beyond had believed that static scheduling of systems which employ multiple sources to drive the same data flow path, such as the case of a bidirectional or multiplexed bus, was not possible. The common wisdom has been that there is no way to resolve contention between two drivers on the same path in the a priori manner required of a statically scheduled simulator. Thus, despite the demand for faster simulation tools for developing systems other than those having a DSP application, statically scheduled simulation has not heretofore been extended to the general case of a system which employs multiple drivers and/or bidirectional data flow.

SUMMARY OF THE INVENTION

The present invention provides a method and apparatus which permits the statically scheduled simulation of systems having data flow paths which are driven by multiple drivers, such as a multiplexed or bidirectional bus.

The present invention includes a method for using a computer to model the data flow behavior of systems designs using statically scheduled simulation techniques, by inserting bus resolution blocks into data paths which are driven by multiple drivers. These bus resolution blocks permit static scheduling of such systems by determining a priori the outcome of any data path contention which might arise. The bus resolution blocks perform this function by representing tables defining outcomes for various combinations of driver states which can arise under the constraints of the system.

Therefore, it is an objective of the present invention to extend the technique of statically scheduled data flow simulation to general systems with multiplicatively driven data paths.

It is a further objective of the present invention to provide a method for permitting the a priori resolution of potential contention between the drivers connected to the multiplicatively driven data path.

It is still further an objective of the present invention to incorporate into a statically scheduled simulation, a method for the insertion of bus resolution blocks into a netlist representing such a system to statically schedule the resolution of potential contention on multiplicatively driven data paths while remaining totally transparent to the user of such.

These and other objectives of the present invention will be apparent to those of ordinary skill in the art in light of the following detailed description of the preferred embodiment.

BRIEF DESCRIPTION OF THE DRAWINGS

FIG. 2 illustrates a programmer's description of the procedure by which bus resolution blocks are inserted in a netlist to break up multidriver nets.

FIG. 3 illustrates a table representing a bus resolution function.

DETAILED DESCRIPTION OF THE INVENTION

The preferred embodiment of the present invention operates on a netlist representation of a system which is specified as an interconnection of functional blocks which make up the system. The blocks are parameterized models of functions which can include adders, multipliers, registers, digital filters, phase locked loops, Fast Fourier Transform units, as well as simpler functions such as logic gates, counters and flip-flops. Those of ordinary skill in the art will appreciate that there are many system design tools available in the market which are capable of modeling the behavior of such blocks.

Figure 1A:
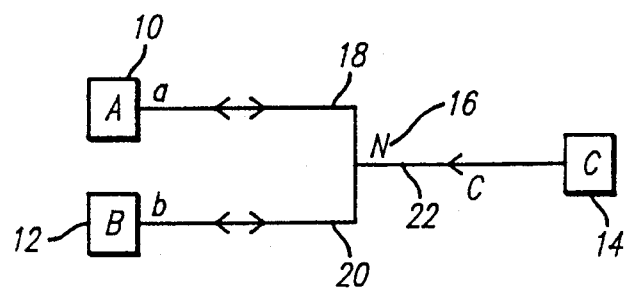
FIG. 1A illustrates the interconnection of three functional blocks A10, B12, and C14 in a net.

The interconnection of one or more outputs of functional blocks to one or more inputs of functional blocks is called a net. FIG. 1A illustrates the interconnection of three functional blocks A 10, B 12 and C 14. The interconnection between blocks A 10, B 12 and C 14 forms net N 16. Net N 16 is comprised of subnets a 18, b 20 and c 22. Subnets a 18 and b 20 indicate bidirectional data flow. Subnet c 22 indicates unidirectional data flow.

To permit static scheduling of the system of FIG. 1A, the method of the present invention substitutes the bidirectional, multiplicatively driven net N 16 with bus resolution blocks so that the data flow over the net N 16 can be resolved a priori between the multiple potential sources of data. A more detailed discussion of the bus resolution block is presented below.

Figure 1B:
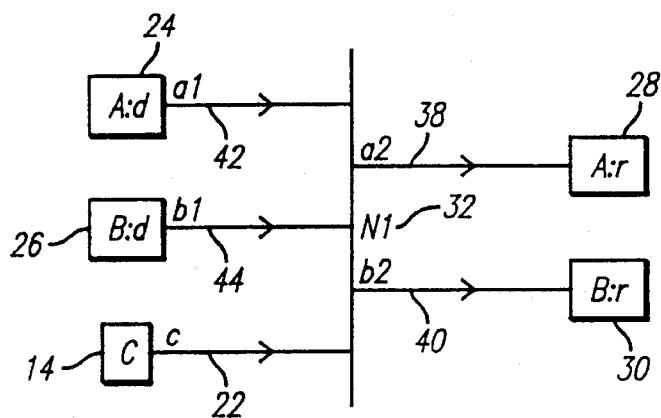
FIG. 1B illustrates the result of the flattening process on the system of FIG. 1A to separate bus drivers from bus readers.

The method of the present invention first flattens the netlist so that any nets which are bidirectional in nature, such as N 16, are represented as multiple drivers and receivers having unidirectional data flow between them. FIG. 1B illustrates the result of this flattening process on the system of FIG. 1A. The bidirectional ports of A 10 and B 12 are each split into two functional sub-blocks. Sub-blocks A:d 24 and B:d 26 each contain the driving function of A 10 and B 12 respectively, and sub-blocks A:r 28 and B:r 30 each contain the read function of blocks A 10 and B 12 respectively. The netlist is updated to reflect the alternative representation illustrated in FIG. 1B. Net N1 32 is completely unidirectional in nature, although still multiplicatively driven.

For each net in the netlist having more than one driver connected to it (i.e. N1 32), the method of the present invention then interposes bus resolution blocks between the multiple drivers on the net and the inputs of functional blocks connected to the nets. The result of this step, as applied to net N1 32 of FIG. 1B is illustrated in FIG. 1C.

Figure 1C:
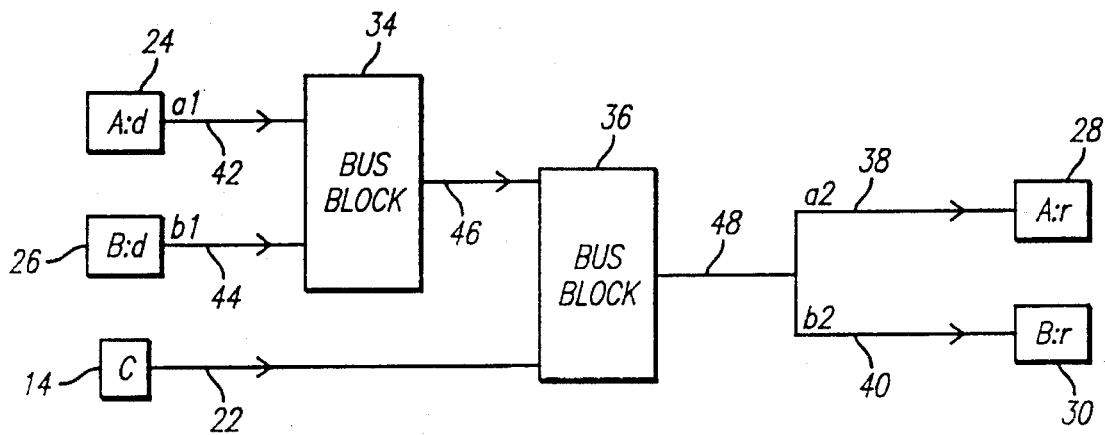
FIG. 1C illustrates the transformation of the flattened system of FIG. 1B by insertion of bus resolution blocks to break up multidriver nets.

The transformation to the representation of FIG. 1C is accomplished by first breaking the connection between two of the drivers (A:d 24 and B:d 26) and the net and connecting outputs a1 42 and b1 44 to the inputs of bus resolution block 34. For each additional driver connected to net N1 32 (i.e. C 14), an additional bus resolution block 36 is inserted by disconnecting the output 22 of the additional driver C 14 from the net (i.e. N1 32) and connecting the output 46 of the last inserted bus resolution block 34 to the first input of the bus resolution block 36 (which is being currently inserted), and connecting the output 22 of the driver C 14 to the second input of bus resolution block 36. When there are no additional drivers which have not been isolated from the net by a bus resolution block, then the inputs (i.e. a2 38 and b2 40) which are connected to the net are disconnected from the net and connected to the output 48 of the last inserted bus resolution block (in this example, block 36).

This procedure is completed for each of the nets having multiple drivers, with the netlist being modified accordingly to reflect the insertion of the bus resolution blocks. The system can then be statically scheduled and simulated. A programmer's description of the above-described procedure is illustrated in FIG. 2.

Those of ordinary skill in the art will recognize that this process can be repeated for any number of nets having any number of drivers and readers attached.

The bus resolution block represents a table of possible input combinations and the user-defined output response to those input combinations. Thus, if multiple drivers would have attempted to drive a net simultaneously, the bus resolution block can be programmed to resolve that conflict as the application dictates.

In many systems, contention for a net is simply not permitted, and so if it occurs, the bus resolution block may flag an error at its output. In those systems where contention is permitted, the bus resolution block can be configured to implement a user defined resolution function to determine the output. An example of a table representing a bus resolution function is illustrated in FIG. 3. Those of ordinary skill will recognize that although the preferred embodiment of the invention employs bus resolution blocks having two inputs, the invention can easily be expanded to the general case of N inputs. Further, those ordinarily skilled in the art will recognize that the bus resolution block can be implemented as simulation primitives or as functions within the simulator.

Although bus resolution functions have been employed in traditional logic simulators which are event driven to dynamically resolve bus contention, the method of the present invention employs them in a manner which has never been contemplated to solve a problem previously thought unsolvable. The present invention essentially statically encapsulates the dynamic behavior of the function into the block, inserts it into a data flow representation of a system having the potential for contention on its data paths, and uses it to permit the static scheduling of the system for simulation which yields orders of magnitude improvement in speed of execution over traditional simulation techniques.

What is claimed is:

1. A method of statically scheduling the execution of a system having bidirectional and multiplicatively driven data paths, said method comprising the steps of:

a) representing the system as a netlist;

b) flattening the netlist to eliminate bidirectional nets;

c) for all multiplicatively driven nets, inserting bus resolution blocks between the drivers and the inputs originally connected to the net;

d) updating the netlist to reflect the insertion of the bus resolution blocks; and e) statically scheduling the system as reflected in the updated netlist.

* * * * *